United States Patent [19]

Kondoh

[11] Patent Number: 5,620,918
[45] Date of Patent: Apr. 15, 1997

[54] METHOD OF PRODUCING CYLINDRICAL STORAGE NODE OF CAPACITOR ON SEMICONDUCTOR SUBSTRATE

[75] Inventor: Kenji Kondoh, Tokyo, Japan

[73] Assignee: NEC Corporation, Tokyo, Japan

[21] Appl. No.: 637,469

[22] Filed: Apr. 25, 1996

[30] Foreign Application Priority Data

Apr. 28, 1995 [JP] Japan ..................................... 7-106350

[51] Int. Cl.⁶ .............................. H01L 21/70; H01L 27/00
[52] U.S. Cl. ............................................ 438/396; 438/949
[58] Field of Search ................................... 437/47, 52, 60, 437/919, 928

[56] References Cited

U.S. PATENT DOCUMENTS

| 5,266,512 | 11/1993 | Kirsch | 437/52 |
| 5,438,010 | 8/1995 | Saeki | 437/52 |
| 5,476,806 | 12/1995 | Roh et al. | 437/52 |

FOREIGN PATENT DOCUMENTS 5-347392  12/1993  Japan .

OTHER PUBLICATIONS

W. Wakamiya et al., "Novel Stacked Capacitor Cell for 64Mb DRAM", 1989 *VLSI Symposium*, pp. 69–70.

*Primary Examiner*—Jey Tsai
*Attorney, Agent, or Firm*—Sughrue, Mion, Zinn, Macpeak & Seas

[57] ABSTRACT

The invention relates to the fabrication of a cylindrical storage node in a stacked capacitor cell of DRAM. A fine, cylindrical slit is formed in an oxide layer on a conductor layer by electron beam lithography using a positive resist which undergoes a reversal to negative by a slight overexposure. By using a local reversal of the exposed resist layer to negative, a fine cylindrical pattern is easily produced in the resist layer, and the pattern is transferred to the oxide layer by etching. Then a conductor such as polysilicon is deposited on the oxide layer to fill the cylindrical slit with the deposited conductor. The conductor in the cylindrical slit appears as a cylindrical part of the storage node when the conductor film on the oxide layer surface and the oxide layer are successively removed. In the case of forming a storage node in the shape of double or multiple cylinder, cylindrical patterning of the resist layer is repeated before etching the underlying oxide layer.

6 Claims, 12 Drawing Sheets

METHOD OF PRODUCING CYLINDRICAL STORAGE NODE OF CAPACITOR ON SEMICONDUCTOR SUBSTRATE

BACKGROUND OF THE INVENTION

This invention relates to a method of producing a cylindrical storage node of a capacitor on a semiconductor substrate. In most cases the capacitor is the main component of a memory cell.

In conventional DRAMs, each memory cell consists of a capacitor and a MOS transistor for switching. This memory cell is simple in construction and can be made relatively small in memory cell area.

A voltage that can be taken out of the memory cell is proportional to the storage capacitance of the capacitor. For high density DRAMs it is necessary to obtain a sufficiently large storage capacitance in a small cell area. In this regard it is prevailing to employ stacked capacitor cells in which a capacitor is stacked over the bit line or word line to reduce the cell area. Usually the stacked capacitor has a curved shape to further increase storage capacitance in a given plane area.

For further enhancement of the density of DRAM cells with further reduction in memory cell area, there is a proposal of a stacked capacitor cell having a cylindrical capacitor: 1989 VLSI Symposium, pp. 69–70. The storage node of the cylindrical capacitor has a hollow cylinder of polysilicon (polycrystalline silicon) which stands vertically on the substrate surface, and both the inner and outer surfaces of the cylinder are used as a capacitor area. With this structure the storage capacitance can be increased with decreasing cell area. The storage capacitance increases with height of the cylinder. For further increase in storage capacitance, the storage node may have two (or more) hollow cylinders which are arranged concentrically and slightly spaced from each other.

The fabrication of the cylindrical capacitor requires a larger number of process steps than the fabrication of conventional stacked capacitors. In the case of a capacitor in the shape of double (or multiple) cylinder the process steps further increase (as will be described hereinafter), and it is difficult to form the outer cylinder with the same height as the inner cylinder.

In this connection, JP-A 5-347392 proposes a relatively simple method for forming a cylindrical or ring-like storage node of a capacitor. This method uses a phase-shifting technique in photolithography to form the storage node. A positive photoresist is applied to a conductor layer (usually polysilicon) which is formed on a substrate surface to form the storage node, and the photoresist layer is exposed to light through a transparent reticle having a phase-shifter which causes phase inversion (180-degree phase shifting) of transmitted light. The shape and size of the phase shifter corresponds to the whole area of the aimed storage node. In a ring-like region below the periphery of the phase-shifter, a shadow is cast by the interference between the phase-inverted light and uninverted light. As a result, the photoresist layer is patterned to a ring-like shape. Using the patterned photoresist as mask, the conductor layer is etched to leave a ring-like part which becomes the storage node. In the case of forming a storage node in the shape of double cylinder, an oxide layer on a conductor layer is cylindrically patterned by using the phase-inverting photolithographic technique, and sidewalls of a conductor are formed on the inner and outer surfaces of the oxide cylinder, followed by removal of the oxide cylinder by etching.

This method is relatively small in the number of process steps. However, the use of the phase-inverting reticle offers inconvenience and entails high cost.

SUMMARY OF THE INVENTION

It is an object of the present invention to provide a relatively simple and economical method for producing a fine, cylindrical storage node on a semiconductor substrate.

A method according to the invention comprises the following sequential steps: (a) forming a first conductor layer, which becomes a base part of a cylindrical storage node, on a semiconductor substrate, (b) forming a sacrificing layer over the first conductor layer, (c) overlaying the sacrificing layer with a positive resist for electron beam lithography which undergoes a reversal to negative and becomes hardly soluble by a slight overexposure, (d) exposing the positive resist layer to an electron beam in a circular area above the first conductor layer to perform a slight overexposure in the major region of the circular area and a proper exposure only in a peripheral region of the circular area, (e) developing the resist layer to thereby form a cylindrical slit in the resist layer in the peripheral region of the circular area, (f) etching the sacrificing layer by using the remaining resist layer as mask to thereby form a cylindrical slit in the sacrificing layer under the cylindrical slit in the resist layer and thereafter removing the resist layer, (g) depositing a second conductor layer on the sacrificing layer to fill the cylindrical slit in the sacrificing layer with the deposited conductor, and (h) etching the second conductor layer until the upper surface of the sacrificing layer is exposed and removing the sacrificing layer. At the end of step (h), the conductor in the cylindrical slit in the sacrificing layer appears as a hollow cylinder standing on the first conductor layer.

It is possible to produce a storage node having two concentrically cylindrical parts by a method according to the invention. In that case, the above described method is modified in the following respects. After the developing step (e), the resist layer is again exposed to an electron beam in another (second) circular area, which is concentrical with and wider than the circular area in step (d), to perform a slight overexposure in the major region of the second circular area and a proper exposure only in a peripheral region of the second circular area. Then the resist layer is again developed to thereby form another (second) cylindrical slit in the resist layer in the peripheral region of the second circular area. After that the steps (f), (g) and (h) are performed without substantial changes. A storage node having more than two cylindrical parts can be produced by further increasing the repetition of the exposure and development procedures.

An important advantage of the invention is that a fine cylinder of a conductor such as polysilicon can easily be formed by a relatively simple electron beam lithography using a positive resist which undergoes a reversal to negative by a slight overexposure. For convenience, such a positive resist will be referred to as a reversal resist. The width of a cylindrical slit formed in the reversal resist layer and, when two or more cylindrical slits are formed, the spacing between the slits can be made very narrow to the extent of about 0.15 μm, but in this method it is unnecessary to directly delineate such fine pattern features.

By this invention a cylindrical stacked capacitor can be fabricated without significantly increasing the number of process steps by comparison with the fabrication of conventional stacked capacitors, and in this method no sidewall is formed even in the case of forming two or more cylinders. The electron beam lithography in this method does not need any reticle. When a storage node having two or more cylinders is produced by a method according to the invention all the cylinders have the same height, and it is easy to increase the cylinder height. Accordingly it is possible to greatly increase the storage capacitance.

The shape of a storage node produced by a method according to the invention is not necessarily literally "cylindrical". It is a matter of course that the invention can be used to produce a ring-like or tubular storage node having a square, rectangular or still differently polygonal shape in cross-section.

The invention is suitable for use in the fabrication of high density DRAMs and can be used also for the fabrication of other semiconductor devices having capacitors such as, for example, ASIC (application specific integrated circuit) devices incorporating a DRAM.

DESCRIPTION OF THE PREFERRED EMBODIMENTS

Figure 2A:
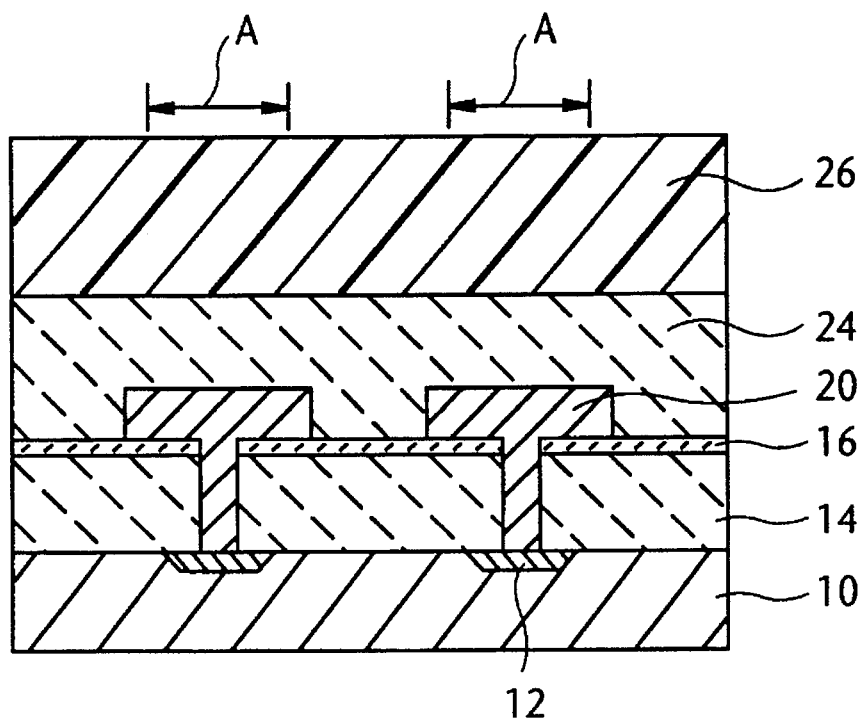
Figure 2B:
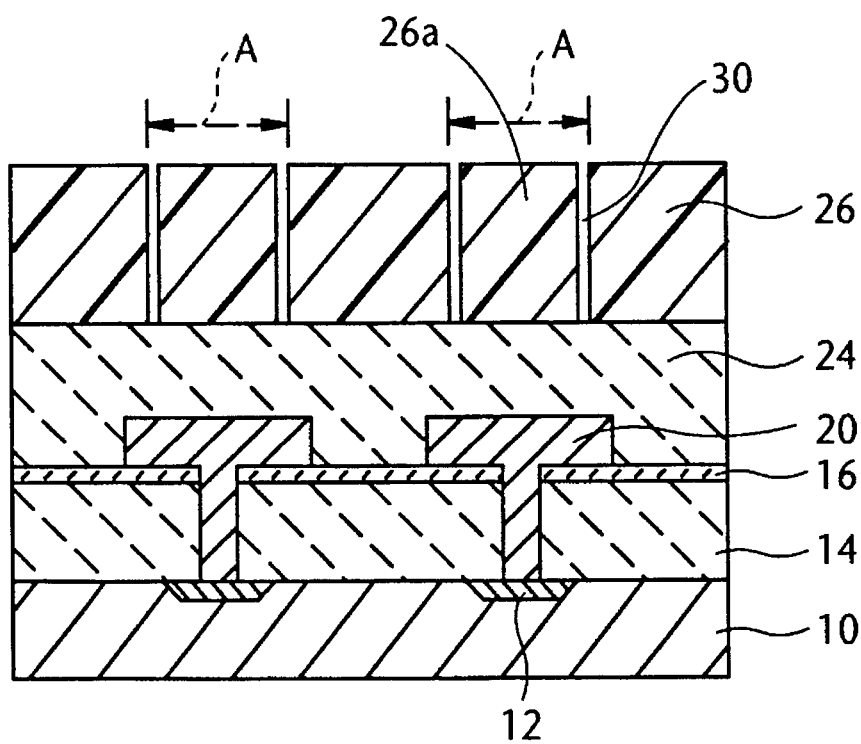
Figure 2C:
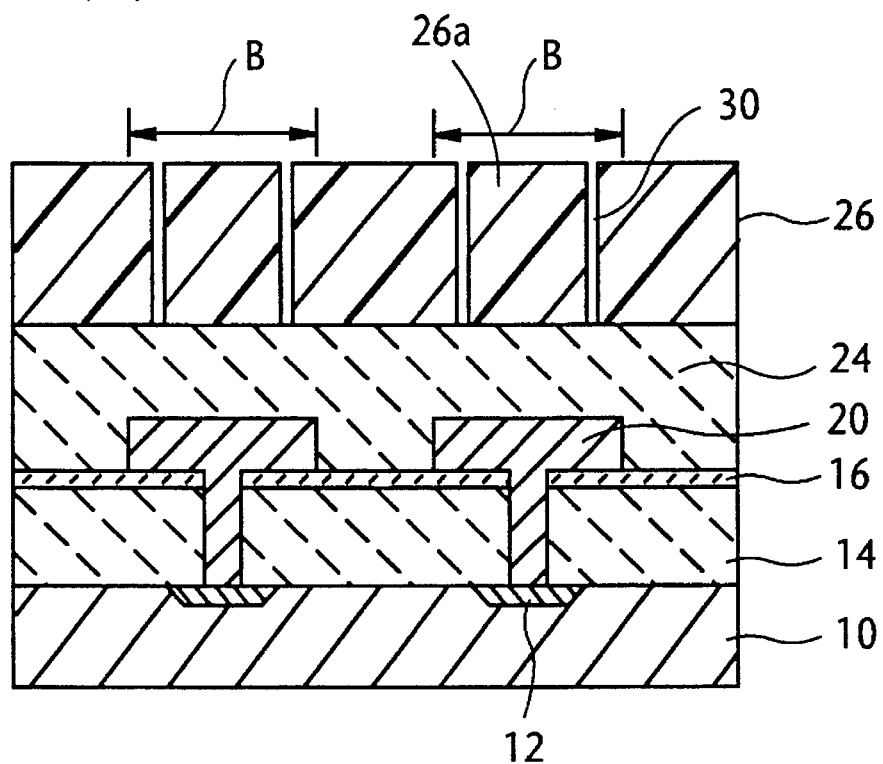
Figure 2D:
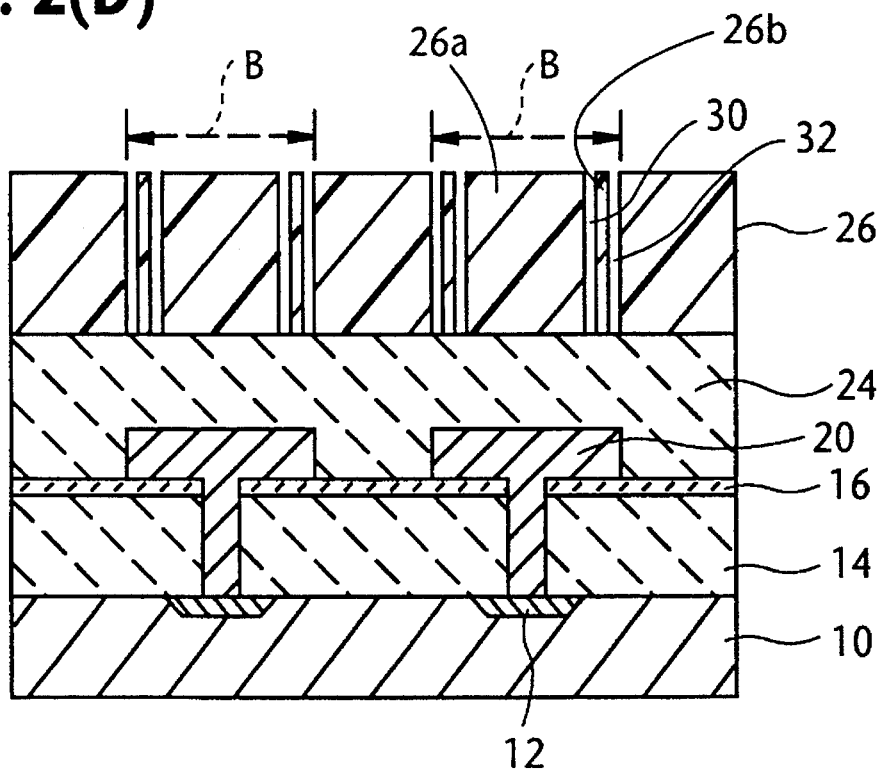
Figure 3A:
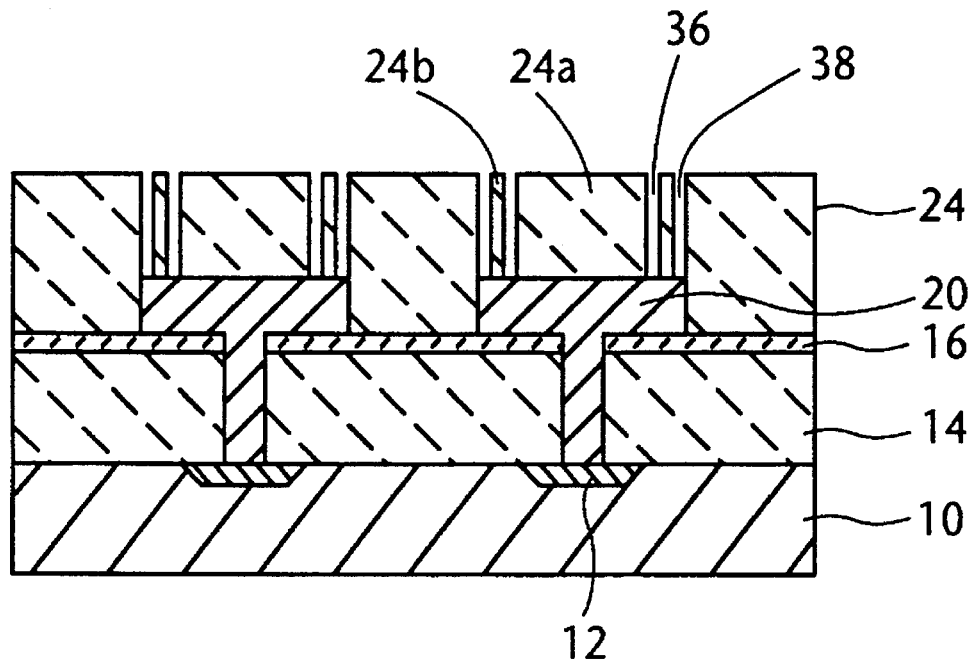
Figure 3B:
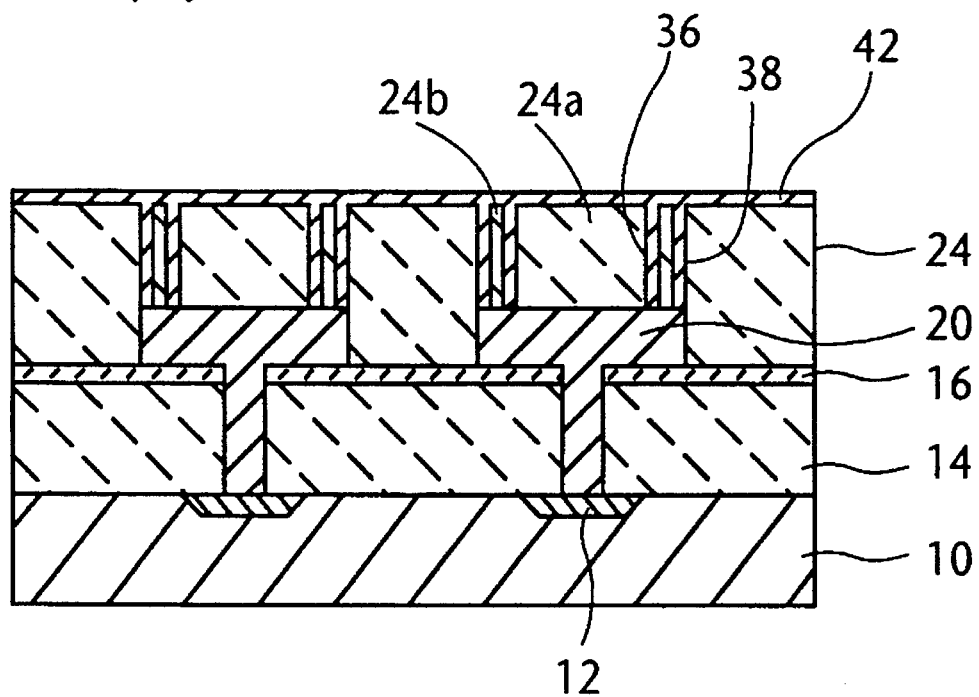
Figure 3C:
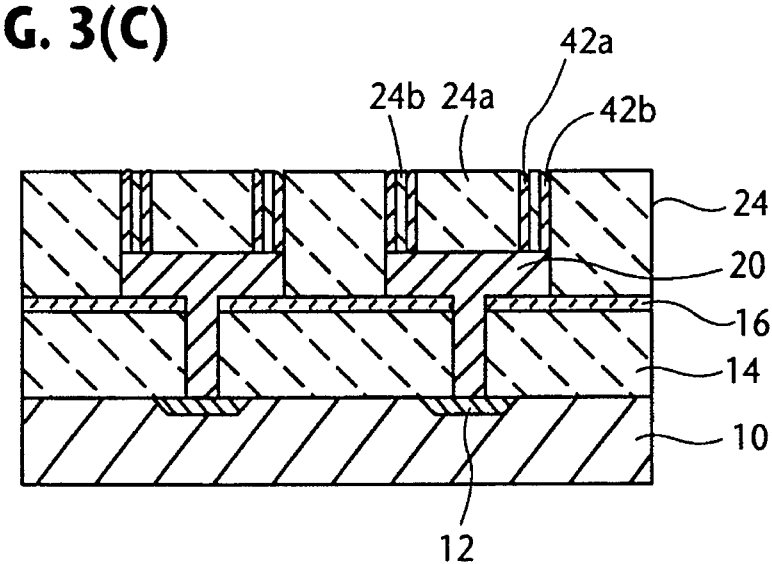
Figure 3D:
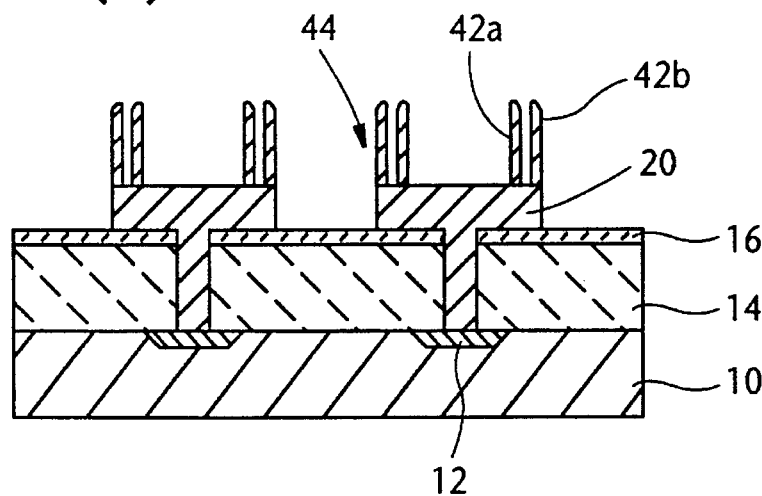
Figure 3E:
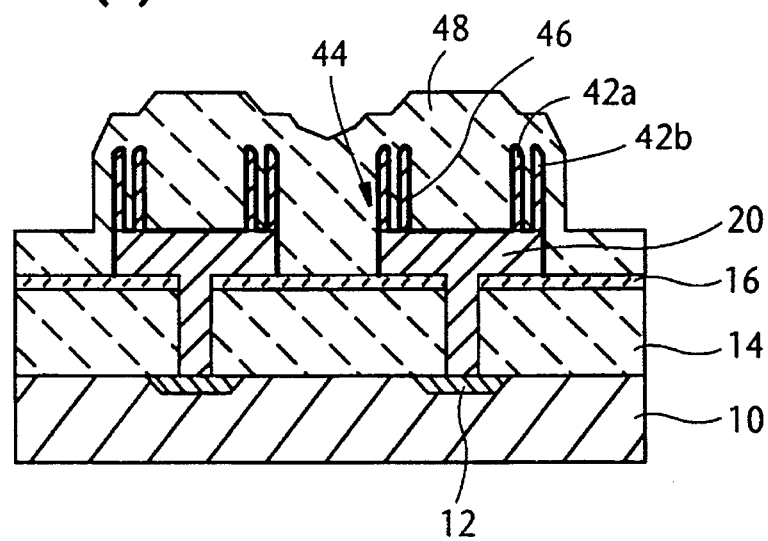

As an embodiment of the invention, FIGS. 1(A) to 3(E) illustrate a process of producing a capacitor in the shape of double cylinder as cylindrical capacitor shown in FIG. 3(E). The capacitor is assumed to be coupled with a switching MOS transistor to make a memory cell. However, for simplicity the transistor is omitted from illustration except the illustration of one source/drain region to which the capacitor is connected.

Figure 1A:
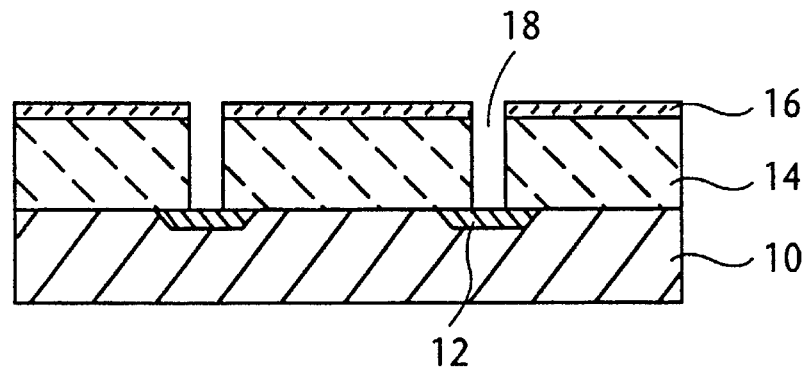
FIGS. 1(A)–1(C), 2(A)–2(D) and 3(A)–3(E) illustrate a process of producing a capacitor in the shape of double cylinder by a method according to the invention.

Referring to FIG. 1(A), in the surface of a p-type silicon substrate 10 the source/drain region 12 of the transistor is formed by introducing an n-type impurity. Next, as an insulating film a silicon dioxide film 14 is deposited on the substrate surface by, for example, a CVD process, and the oxide film 14 is overlaid with a silicon nitride film 16 by a CVD process. Then, above the source/drain region a capacitor contact hole 18 is formed through the nitride and oxide films 16, 14 by photolithographic and dry etching procedures.

Figure 1B:
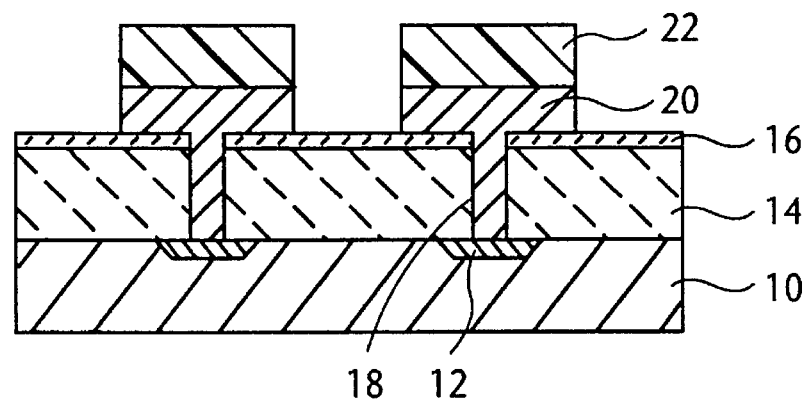

Referring to FIG. 1(B), in an area where a cylindrical storage noed of a capacitor is to be produced, a conductor part 20 is formed by the following procedures. The conductor part 20 fills the contact hole 18 to make contact with the source/drain region 12. First, polysilicon (20) is deposited by CVD on the whole area of the silicon nitride film 16 so that the contact hole 18 is filled with polysilicon, and phosphorus is diffused into the deposited polysilicon. Next, a photoresist 22 is applied to the surface of the polysilicon layer (20) and patterned by photolithography to define the shape of the conductor part 20. In the remaining areas the polysilicon layer is removed by dry etching.

Figure 1C:
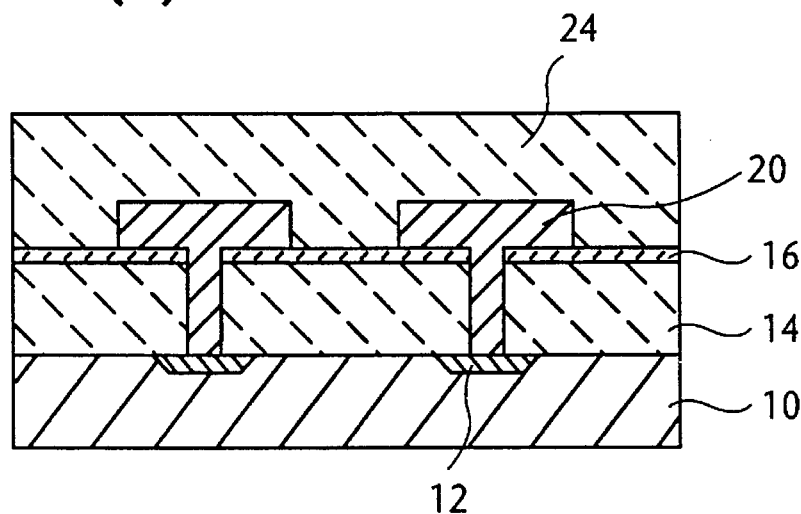

Referring to FIG. 1(C), the photoresist pattern 22 on the conductor part 20 is removed. Then a silicon dioxide layer 24, called a sacrificing layer, is deposited by CVD over the whole area of the silicon nitride film 16 including the conductor part 20. The thickness of the sacrificing layer 24 is controlled according to the height of the cylindrical capacitor to be produced.

Referring to FIG. 2(A), the surface of the sacrificing layer 24 is covered with a positive resist 26 for electron beam lithography. The resist 26 is of the reversal type explained hereinbefore. The reversal resist layer 26 is exposed to an electron beam in a first exposure area A, which is a circular area aligned with the conductor part 20 under the sacrificing layer 24 and is narrower than the surface area of the conductor part 20. In the exposure operation, a slight overexposure is performed. Then, post-exposure baking of the resist layer 26 is performed.

After that the resist layer 26 is developed by a usual developing solution. In the unexposed areas the positive resist 26 remains undissolved. Furthermore, as shown in FIG. 2(B), in the major region of the first exposure area A the resist 26a remains undissolved because of the reversal to negative caused by the overexposure. However, only in a peripheral, annular region (30) of the first exposure area A the resist 26 is dissolved because in this region the intensity of the electron beam was weaker than in the central major region (26a) so that the exposure was within the range of proper exposure. Consequently a cylindrical slit 30 is formed in the resist layer 26 above the conductor part 20.

Referring to FIG. 2(C), the resist layer 26 is again exposed to an electron beam in a second exposure area B which is aligned with the conductor part 20 and is slightly wider than the first exposure area A. In the exposing operation, a slight overexposure is performed.

Referring to FIG. 2(D), after post-exposure baking the resist layer 26 is again developed. In the major region of the second exposure area B the resist 26 still remains undissolved because of the overexposure. However, in a peripheral, annular region the resist 26 is dissolved as a result of relatively weak exposure in this region. Therefore, another cylindrical slit 32 is formed in the resist layer 26 above the conductor part 20. In other words, above the conductor part 20 the resist layer 26 remains in the form of a solid cylinder 26a in the center and a hollow cylinder 26b surrounding the solid cylinder 26a. The width of each cylindrical slit 30, 32 and the thickness of the cylinder 26b can be made very small to the extent of about 0.15 m.

Using the resist pattern shown in FIG. 2(D) as mask, the sacrificing layer 24 is etched until the upper surface of the conductor part 20 is exposed. That is, the sacrificing layer 24 is etched only in annular areas under the cylindrical slits 30, 32 in the resist layer 26. After that the resist layer 26 is removed.

As a result, as shown in FIG. 3(A), two concentrically cylindrical slits 36 and 38 are formed in the sacrificing layer 24 above the conductor part 20. In other words, above the conductor part 20 the sacrificing layer 24 remains in the form of a solid cylinder 24a in the center and a hollow cylinder 24b surrounding the solid cylinder 24a.

Referring to FIG. 3(B), another conductor part 42 is formed by depositing polysilicon (for example, by CVD) on the sacrificing layer 24 so as to fill the cylindrical slits 36, 38 in the sacrificing layer 24 and diffusing phosphorus into the deposited polysilicon. Then the conductor part 42 is etched by a dry etching method until the upper surface of the sacrificing layer 24 is exposed. Referring to FIG. 3(C), the conductor part 42 remains in the form of two concentrically cylindrical parts 42a amd 42b embedded in the sacrificing layer 24. Preferably the upper edges of these cylindrical parts 42a, 42b are chamfered, as illustrated, by the dry ethching operation. For this purpose the dry etching is performed under such etching conditions that polysilicon doped with phosphorus (conductor part 42) can be etched at a sufficiently higher rate than silicon dioxide (sacrificing layer 24).

Next, Referring to FIG. 3(D), the sacrificing layer 24 is completely removed by etching with a suitable etching liquid such as diluted hydrofluoric acid. As the result, a storage node 44 in the shape of double cylinder is formed. That is, the storage node 44 has two concentrically cylindrical parts 42a, 42b standing on a base part 20.

Referring to FIG. 3(E), a capacitor is obtained by depositing a dielectric capacitance film 46 on the surfaces of the base part 20 and cylindrical parts 42a, 42b of the storage node and then forming a capacitor cell plate 48 over the dielectric film 46. For example, the dielectric film 46 is a two-layer film formed by CVD of a silicon nitride film and thermal oxidation of the nitride film, and the cell plate 48 is formed by CVD of polysilicon and diffusion of phosphorus into the deposited polysilicon.

As the reversal resist in this invention it is suitable to use a positive, chemical amplification resist which essentially consists of an organic polymer (resin) and an acid generator. For example, the polymer is a substituted polyhydroxystyrene in which hydroxyl groups of polyhydroxystyrene are partially substituted by tert-butoxy carbonyl (t-BOC) group. By exposure to an electron beam the acid generator decomposes to generate a protonic acid, and by post-exposure baking the acid acts as a catalyst to decompose the t-BOC groups of the polymer. Consequently phenolic hydroxyl groups are regenerated in the polymer, so that the polymer becomes readily soluble in an alkaline developer liquid. In this invention it is required that the chemical amplification resist, which is a positive resist, should undergo reversal to negative by a slight overexposure. In other words, the resist is required to be relatively narrow in a gap between proper exposure and an overexposure which causes reversal of the resist to negative. This requirement can be met by increasing the molecular weight of the polymer to decrease solubility in alkali, using a relatively large amount of an acid generator which is hardly soluble in alkali and, preferably, selecting an acid generator of which decomposition is efficiently promoted by heat.

For comparison, FIGS. 6(A) to 6(I) illustrate a process of producing a capacitor in the shape of double cylinder by a known method.

Figure 6A:
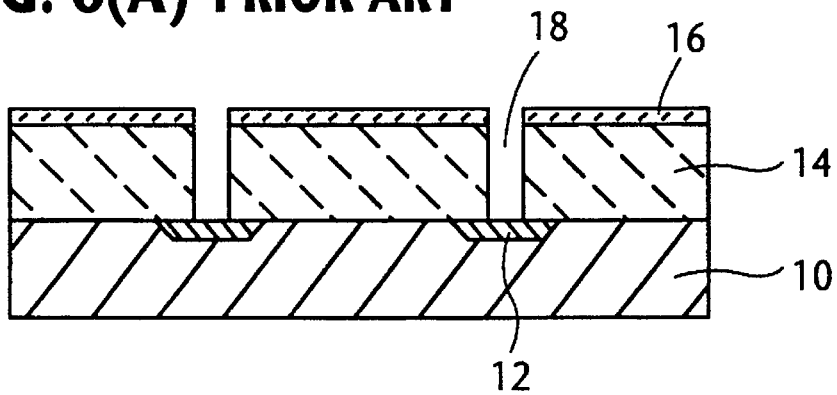
FIGS. 6(A)–6(I) illustrate a known process of producing a capacitor in the shape of double cylinder.

FIG. 6(A) is identical with FIG. 1(A). A source/drain region 12 of a switching transistor (the other parts of the transistor is omitted from illustration) is formed in the surface of a p-type silicon substrate 10. A silicon dioxide layer 14 and a silicon nitride layer 16 are successively deposited on the substrate surface, and a capacitor contact hole 18 is formed through the nitride and oxide films 16, 14.

Figure 6B:
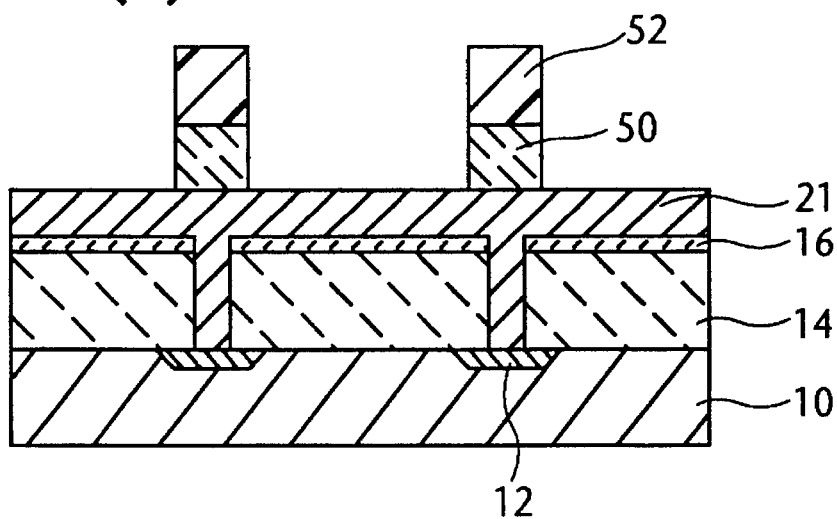

Referring to FIG. 6(B), a first conductor layer 21 is formed by depositing polysilicon on the nitride film 16 by CVD and diffusing phosphorus into the deposited polysilicon. The contact hole 18 is filled with the deposited polysilicon. Next, silicon dioxide film (50) is deposited on the entire area of the conductor layer 21. A photoresist 52 is applied to the oxide film (50) and patterned by photolithography to define a central area of a storage node. In the remaining areas the oxide layer (50) is removed by dry etching. The oxide layer 50 left in the area defined by the patterned resist 52 is used as a first sacrificing layer. Then the resist pattern 52 is removed.

Figure 6C:
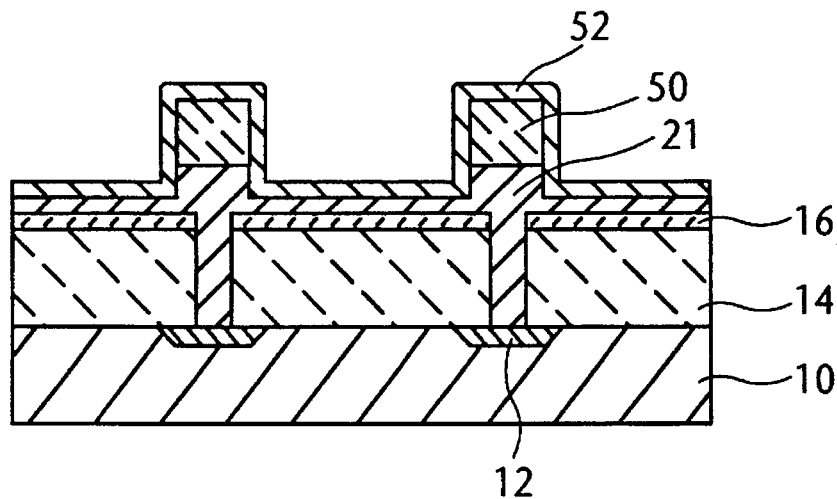

Referring to FIG. 6(C), using the sacrificing layer 50 as mask, the first conductor layer 21 is etched in order to appropriately reduce the thickness. Next, a second conductor layer 52 is formed on the first conductor layer 21 and the sacrificing layer 50 by the deposition of polysilicon (usually by CVD) and subsequent diffusion of phosphorus.

Figure 6D:
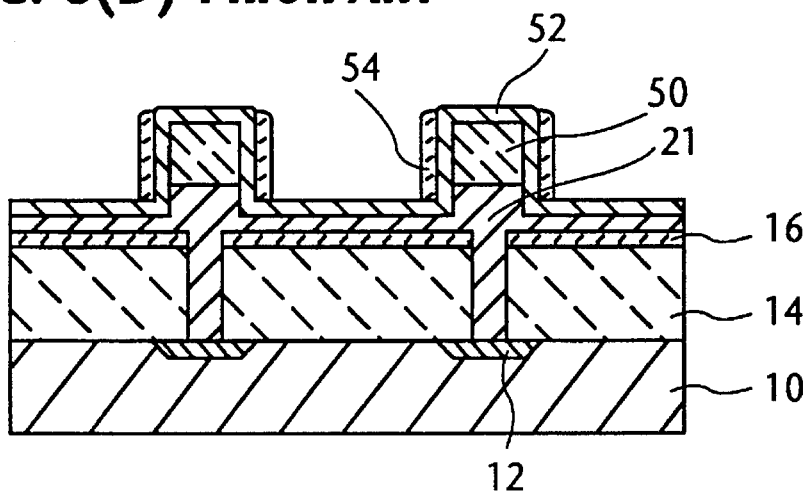

Next, a silicon dioxide film is deposited (usually be CVD) on the entire area of the second conductor layer 52, and etchback of the deposited oxide film is performed by a dry etching technique to leave the oxide film only as a cylindrical sidewall 54, as shown in FIG. 6(D), around the first sacrificing layer 50 and the thick part of the first conductor layer 21. The oxide sidewall 54 is used as a second sacrificing layer.

Figure 6E:
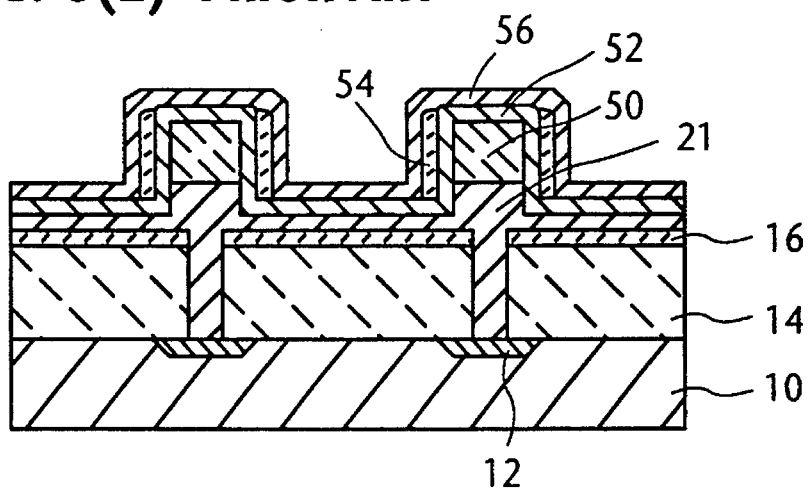
Figure 6F:
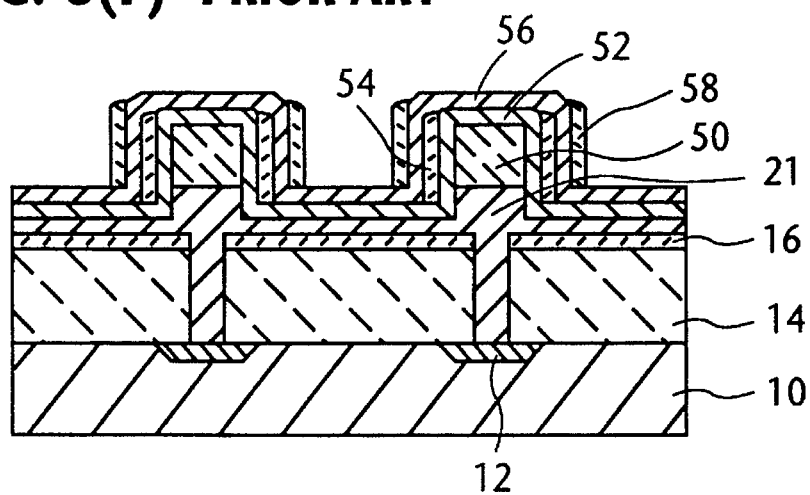

Referring to FIG. 6(E), a third conductor layer 56 is formed on the second conductor layer 52 and the second sacrificing layer 54 by the method used for forming the second conductor layer 52. Next, as shown in FIG. 6(F), a cylindrical sidewall 58 of silicon dioxide, which is a third sacrificing layer, is formed on the third conductor layer 56 around the first sacrificing layer 54 by the method used for forming the second sacrificing layer 54.

Figure 6G:
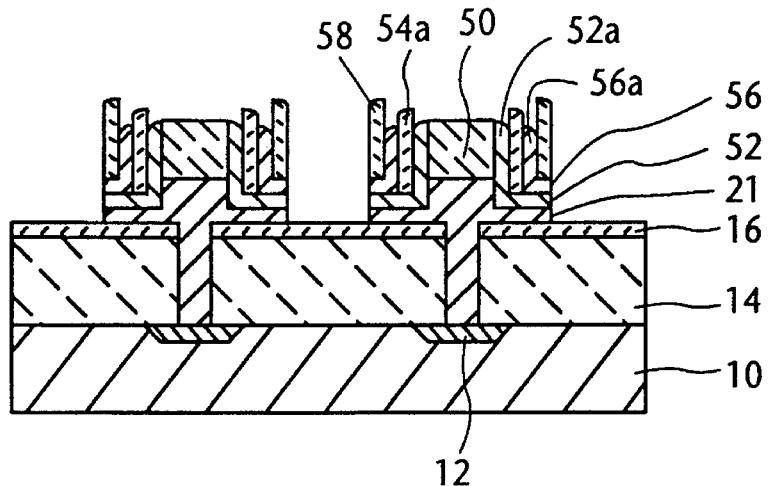

Next, the first, second and third conductor layers 21, 52 and 58 are etched by a dry etching method until the upper surfaces of the first sacrificing layer 50 and the silicon nitride film 16 are exposed as shown in FIG. 6(G). The dry etching is performed under such conditions that polysilicon doped with phosphorus (conductor layers 21, 52, 56) can be etched at a sufficiently higher rate than silicon dioxide (sacrificing layers 50, 54, 58). As a result, the conductor layers 21, 52, 56 remain only in the area of an aimed storage node, and the second and third conductor layers 52 and 56 have cylindrical sidewall parts 52a and 56a, respectively.

Figure 6H:
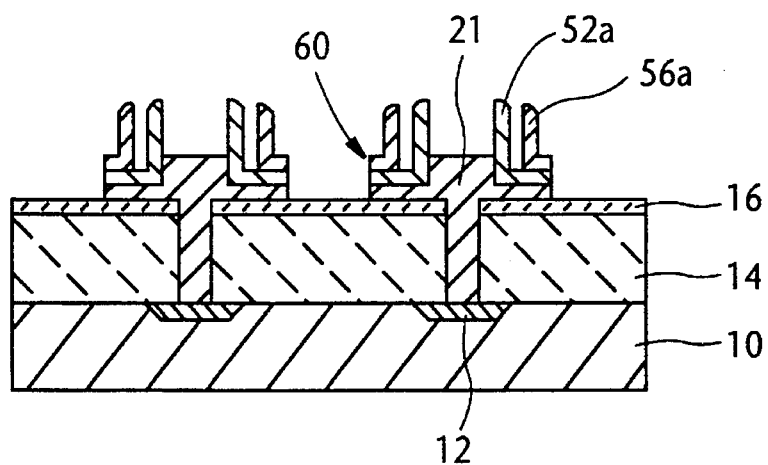
Figure 6I:
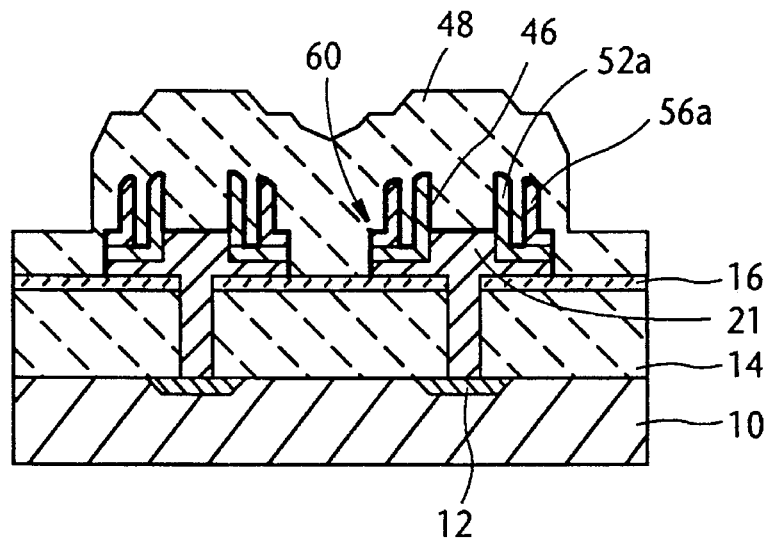

Next, the sacrificing layers 50, 54, 58 are removed by etching with, for example, diluted hydrofluoric acid. As shown in FIG. 6(H), a storage node 60 having two concentrically cylindrical parts 52a and 56a is obtabined. Referring to FIG. 6(I), a capacitor is obtained by depositing a dielectric capacitance film 46 on the surfaces of the base part 21 and cylindrical parts 52a, 56a of the storage node and then forming a capacitor cell plate 48 over the dielectric film 46.

In the process illustrated in FIGS. 6(A) to 6(I) it is necessary to form the oxide sidewalls 54 and 58. The process according to the invention, FIGS. 1(A) to 3(E), does not form any oxide sidewall and therefore decreases in the total number of process steps. In the storage node 60 in FIG. 6(H), the outer cylinder 56a becomes shorter in height than the inner cylinder 52a since the third conductor layer 56 which provides the outer cylinder 56a is formed on the second conductor layer 52 which provides the inner cylinder 52a. In the storage node 44 in FIG. 3(D) the inner and outer cylinders 42a and 42b have the same height and can be made taller than the cylinders 52a, 56a in FIG. 6(H). Therefore, with this storage node 44 it is possible to considerably increase the storage capacitance in a given cell area.

FIGS. 4(A) to 5(E) show modifications of the process of FIGS. 1(A) to 3(E) to produce a storage node having three concentrically cylindrical parts.

Figure 4A:
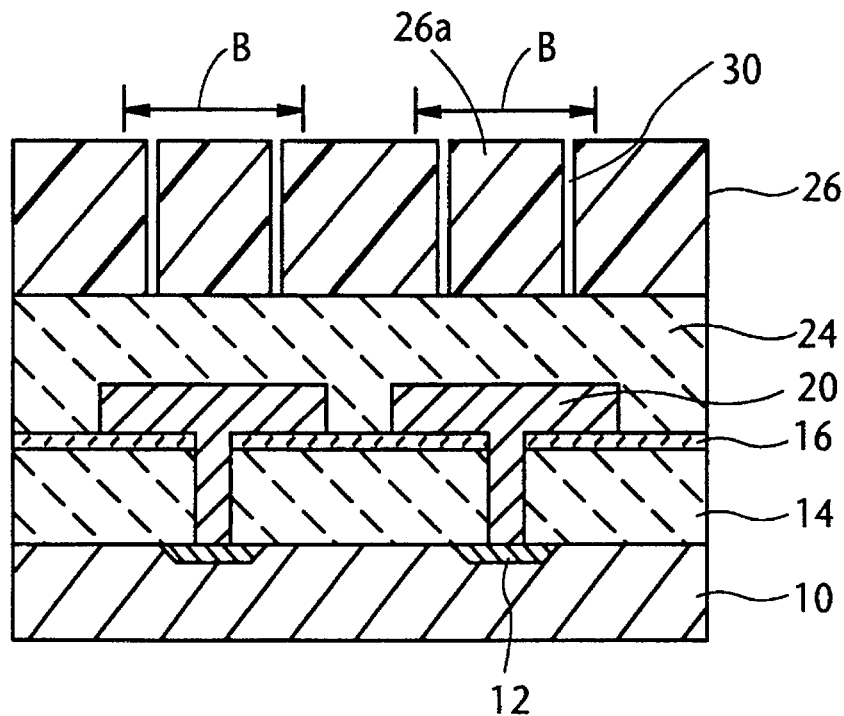
FIGS. 4(A)–4(D) and 5(A)–5(E) illustrate modifications of the process of FIGS. 1(A)–3(E) to produce a capacitor in the shape of triple cylinder.
Figure 4B:
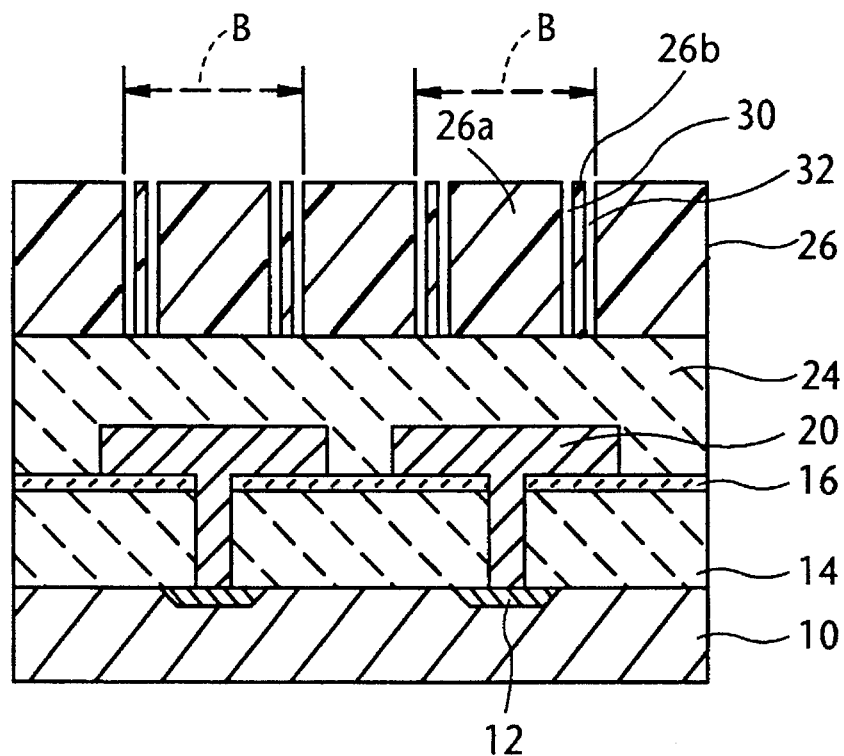

FIG. 4(A) corresponds to FIG. 2(C). There is no substantial change in the preceding steps. In this case the second exposure area B is narrower than the surface area of the conductor part 20. The second exposure is performed in the manner as described with reference to FIGS. 2(C) and 2(D). The result is a resist pattern shown in FIG. 4(B) which corresponds to FIG. 2(D).

Figure 4C:
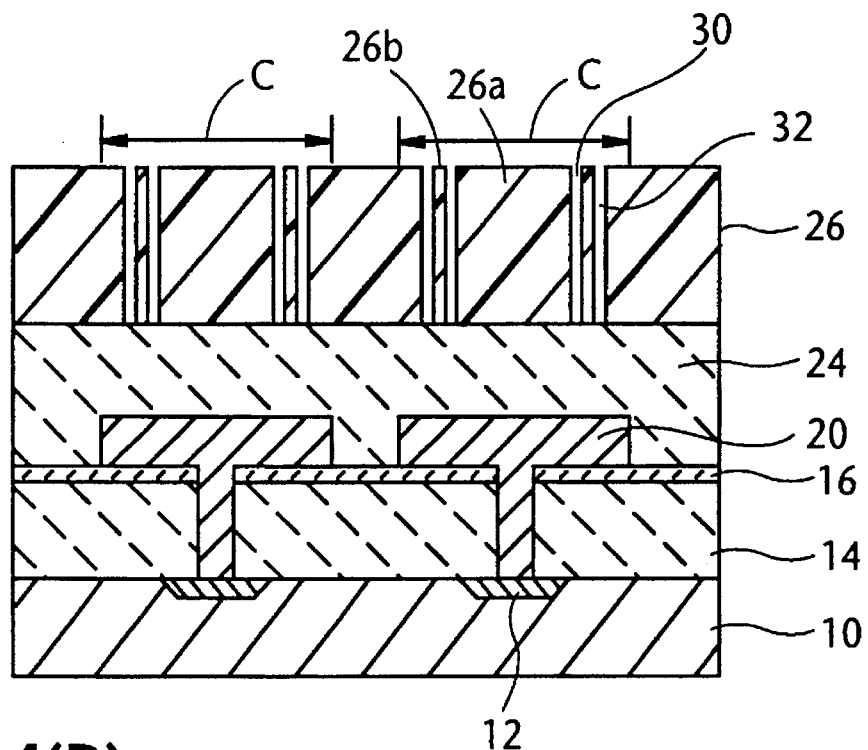

Referring to FIG. 4(C), the patterned resist layer 26 is further exposed to an electron beam in a third exposure area C which is aligned with the conductor part 20 and is slightly wider than the second exposure area B. In the exposing operation, a slight overexposure is performed.

Figure 4D:
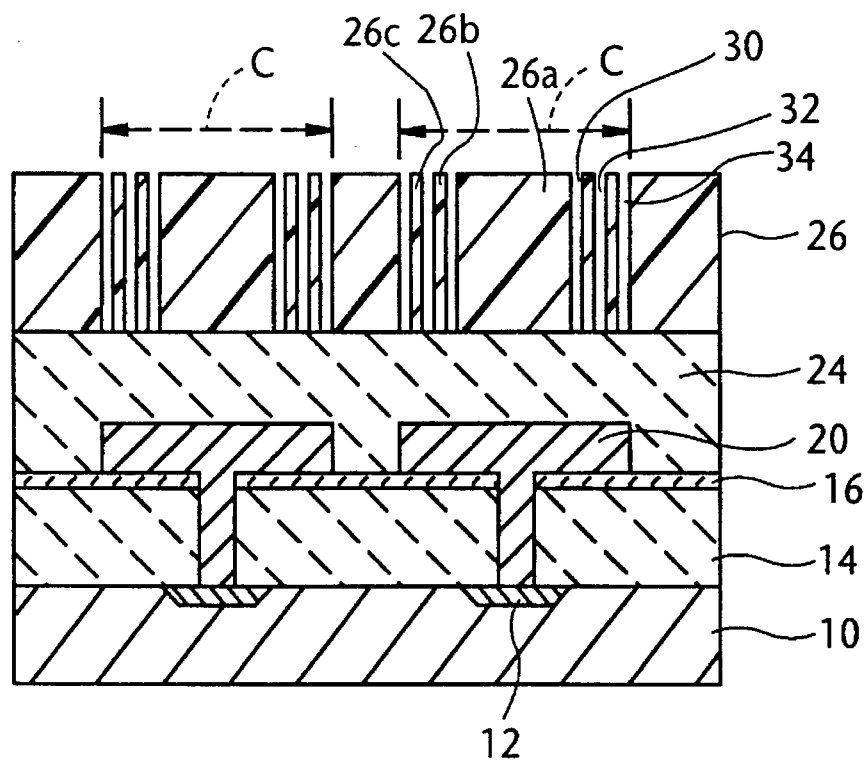

Referring to FIG. 4(D), after the third exposure and post-exposure baking, the resist layer 26 is developed. In the major part of the third exposure area C the resist 26 still remains undissolved because of the overexposure. However, in a peripheral, annular region the resist 26 is dissolved as a result of relatively weak exposure in this region. Therefore, another cylindrical slit 34 is formed in the resist layer 26 above the conductor part 20. In other words, above the conductor part 20 the resist layer 26 remains in the form of a solid cylinder 26a in the center and two hollow cylinders 26b and 26c concentrically surrounding the solid cylinder 26a.

Using the resist pattern shown in FIG. 4(D) as mask, the sacrificing layer 24 is etched until the upper surface of the conductor part 20 is exposed. That is, the sacrificing layer 24 is etched only in annular areas under the cylindrical slits 30, 32, 34 in the resist layer 26. After that the resist layer 26 is removed.

Figure 5A:
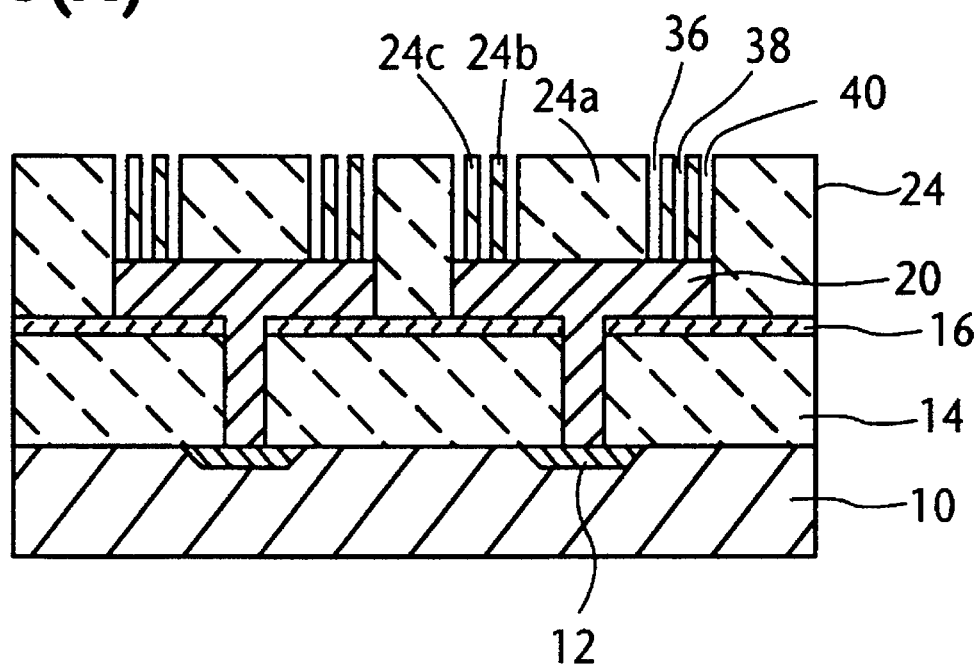

As a result, as shown in FIG. 5(A), three concentrically cylindrical slits 36, 38 and 40 are formed in the sacrificing layer 24 above the conductor part 20. In other words, above the conductor part 20 the sacrificing layer 24 remains in the form of a solid cylinder 24a in the center and two hollow cylinders 24b, 24c concentrically surrounding the solid cylinder 24a.

Figure 5B:
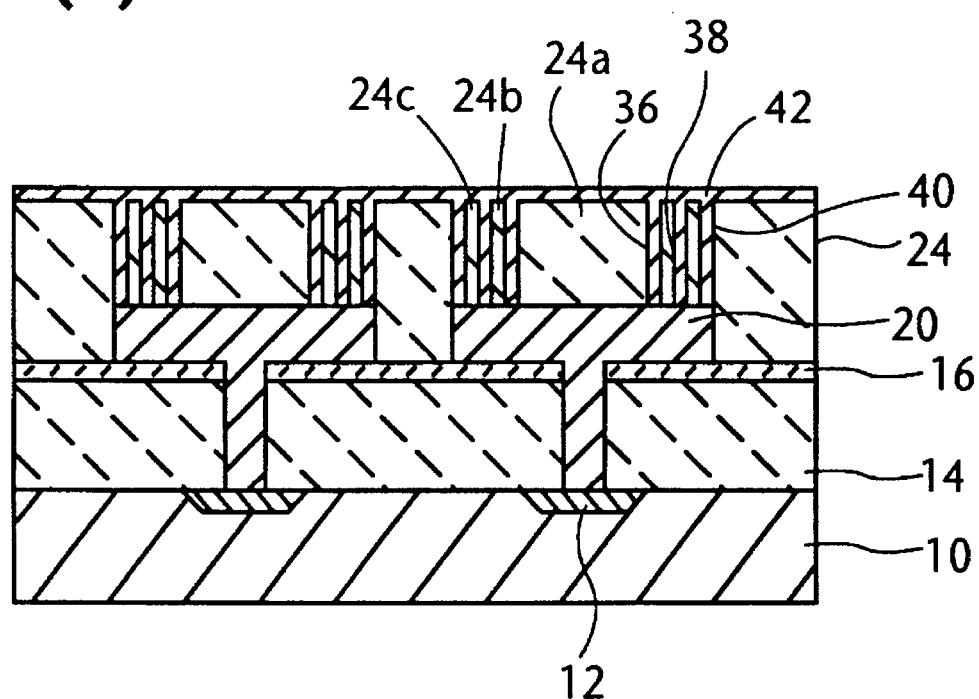
Figure 5C:
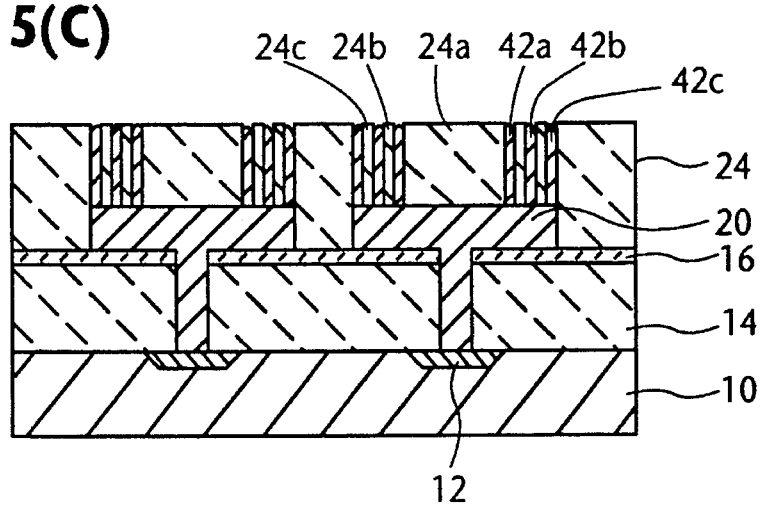
Figure 5D:
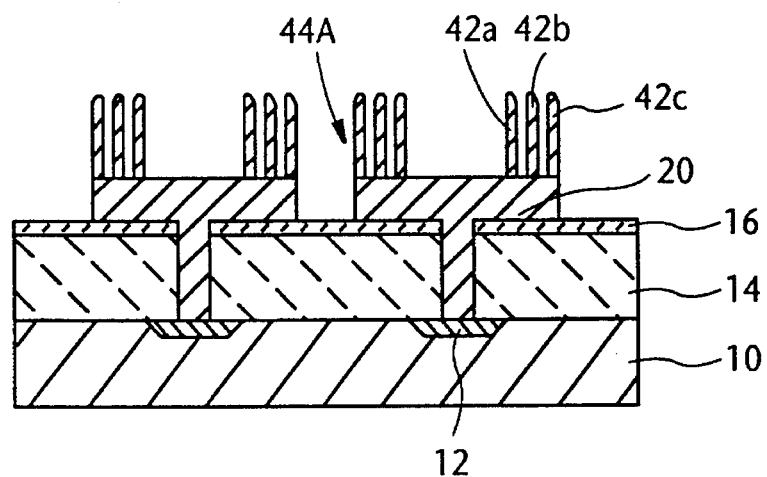
Figure 5E:
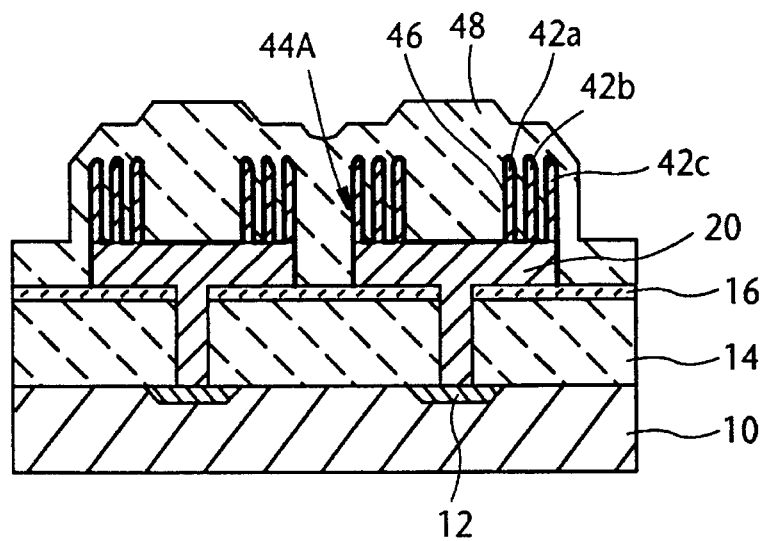

FIG. 5(B) corresponds to FIG. 3(B). In this case polysilicon of the conductor layer 42 fills the three cylindrical slits 36, 38, 40 in the sacrificing layer 24. FIGS. 5(C) to 5(E) correspond to FIGS. 3(C) to 3(E), respectively. The etching of the conductor layer 24 to the state of FIG. 5(C) and the subsequent etching of the sacrificing layer 24 are performed in the manner as described with reference to FIGS. 3(C) and 3(D). As the result, as shown in FIG. 5(D), a storage node 44A having three concentrically cylindrical parts 42a, 42b, 42c is obtained. The three cylindrical parts 42a, 42b, 42c have the same height. Of course the increase in the number of cylindrical parts of the storage node is for increasing the storage capacitance without significantly enlarging the capacitor cell area. If desired a storage node having more than three cylindrical parts can be produced by increasing the repetition of the cylindrical patterning of the reversal resist layer 26. FIG. 5(E) shows the deposition of the dielectric capacitance film 46 on the storage node 44A and the formation of the capacitor cell plate 48 to produce a capacitor.

What is claimed is:

1. A method of producing a cylindrical storage node of a capacitor on a semiconductor substrate, the method comprising the steps of:

(a) forming a first conductor layer, which becomes a base part of the storage node, on the substrate;

(b) forming a sacrificing layer over the first conductor layer;

(c) overlaying the sacrificing layer with a positive resist layer for electron beam lithography which undergoes a reversal to negative and becomes undissolvable by a slight overexposure;

(d) exposing the positive resist layer to an electron beam in a circular area above the first conductor layer to perform a slight overexposure in a major region of the circular area and a proper exposure only in a peripheral region of the circular area;

(e) developing the resist layer to thereby form a cylindrical slit in the resist layer in the peripheral region of said circular area;

(f) etching said sacrificing layer by using the remaining resist layer as mask to thereby form a cylindrical slit in the sacrificing layer under the cylindrical slit in the resist layer and thereafter removing the resist layer;

(g) depositing a second conductor layer on the sacrificing layer to fill said cylindrical slit in the sacrificing layer with the deposited conductor; and (h) etching the second conductor layer until the upper surface of the sacrificing layer is exposed and removing the sacrificing layer, whereby the conductor in said cylindrical slit in the sacrificing layer appears as a hollow cylinder standing on said first conductor layer.

2. A method according to claim 1, wherein said sacrificing layer is an oxide layer.

3. A method according to claim 1, wherein said first and second conductor layers are polysilicon layers.

4. A method of producing a cylindrical storage node of a capacitor on a semiconductor substrate, the storage node having at least two concentrically cylindrical parts, the method comprising the steps of:

(a) forming a first conductor layer, which becomes a base part of the storage node, on the substrate;

(b) forming a sacrificing layer over the first conductor layer;

(c) overlaying the sacrificing layer with a positive resist for electron beam lithography which undergoes a reversal to negative and becomes dissolvable by a slight overexposure;

(d) exposing the positive resist layer to an electron beam in a first circular area above the first conductor layer to perform a slight overexposure in the major region of the circular area and a proper exposure only in a peripheral region of said circular area;

(e) developing the resist layer to thereby form a first cylindrical slit in the resist layer in the peripheral region of said circular area;

(f) again exposing the resist layer to an electron beam in a second circular area, which is concentrical with and wider than said first circular area, to perform a slight overexposure in a major region of the second circular area and a proper exposure only in a peripheral region of the second circular area;

(g) again developing the resist layer to thereby form a second cylindrical slit in the resist layer in the peripheral region of said second circular area;

(h) etching said sacrificing layer by using the remaining resist layer as mask to thereby form two concentrically cylindrical slits in the sacrificing layer under the first and second cylindrical slits in the resist layer;

(i) removing the resist layer;

(j) depositing a second conductor layer on the sacrificing layer to fill said two concentrically cylindrical slits in the sacrificing layer with the deposited conductor; and (k) etching the second conductor layer until the upper surface of the sacrificing layer is exposed and removing the sacrificing layer, whereby the conductor in said two concentrically cylindrical slits in the sacrificing layer appear as two hollow cylinders concentrically standing on said first conductor layer.

5. A method according to claim 4, wherein said sacrificing layer is an oxide layer.

6. A method according to claim 4, wherein said first and second conductor layers are polysilicon layers.

* * * * *